US008629737B2

(12) United States Patent
Wang et al.

(10) Patent No.: US 8,629,737 B2
(45) Date of Patent: Jan. 14, 2014

(54) SIGNAL PROCESSING APPARATUS

(75) Inventors: Kun-Yin Wang, Tainan (TW); Tao-Yao Chang, Taichung (TW); Chorng-Kuang Wang, Taipei (TW); Shen-Iuan Liu, Taipei (TW)

(73) Assignees: Mediatek Inc., Hsin-Chu (TW); National Taiwan University, Taipei (TW)

( * ) Notice: Subject to any disclaimer, the term of this patent is extended or adjusted under 35 U.S.C. 154(b) by 0 days.

(21) Appl. No.: 13/544,444

(22) Filed: Jul. 9, 2012

(65) Prior Publication Data

US 2013/0257509 A1    Oct. 3, 2013

Related U.S. Application Data

(60) Provisional application No. 61/617,717, filed on Mar. 30, 2012.

(51) Int. Cl.
*H01P 5/12*    (2006.01)
*H01F 30/06*    (2006.01)

(52) U.S. Cl.
USPC ........................................ 333/117; 333/119

(58) Field of Classification Search
USPC ................... 333/24 R, 25, 26, 117, 119, 238
See application file for complete search history.

(56) References Cited

U.S. PATENT DOCUMENTS

| | | | | |
|---|---|---|---|---|
| 1,891,297 A | * | 12/1932 | Wintringham | ............ 330/124 R |
| 3,317,849 A | * | 5/1967 | Smith-Vaniz | ................. 330/286 |
| 3,325,587 A | * | 6/1967 | Sontheimer | ................. 174/72 R |
| 3,503,016 A | * | 3/1970 | Podel | ............................. 333/119 |
| 7,425,869 B2 | * | 9/2008 | Aoki et al. | ..................... 330/276 |
| 8,064,871 B2 | * | 11/2011 | Kuo et al. | ..................... 455/326 |
| 2007/0069717 A1 | * | 3/2007 | Cheung et al. | ............. 324/158.1 |

OTHER PUBLICATIONS

Chang, T.Y., et al.; "A 77 GHz Power Amplifier Using Transformer-Based Power Combiner in 90 nm CMOS;" IEEE; 2010; pp. 1-4.
Yishay, R.B., et al; "A High Gain Wideband 77GHz SiGe Power Amplifier;" IEEE Radio Frequency Integrated Circuits Symposium; 2010; pp. 529-532.
Lai, J.W., et al.; "A 1V 17.9dBm 60GHz Power Amplifier in Standard 65nm CMOS;" IEEE International Solid-State Circuits Conference; Session 23; 2010; pp. 424-426.
Martineau, B., et al.; "A 53-to-68 GHz 18dBm Power Amplifier with an 8-Way Combiner in Standard 65nm CMOS;" IEEE International Solid-State Circuits Conference; Seesion 23; 2010; pp. 428-429.

(Continued)

*Primary Examiner* — Dean O Takaoka
(74) *Attorney, Agent, or Firm* — McClure, Qualey & Rodack, LLP

(57) ABSTRACT

The signal processing apparatus contains a first signal transforming circuit and a second signal transforming circuit. The first signal transforming circuit includes four first coupled lines and two second coupled lines, wherein two ends of each first coupled line are configured to carry a first pair of differential signals respectively, each second coupled line is magnetically coupled to two of the first coupled lines in parallel and comprises two signal ports, to which the two ends of each of the magnetically-coupled first coupled lines are placed symmetrically for transferring a second pair of differential signals. The second signal transforming circuit is configured to convert between the second pairs of differential signals at the signal ports and a third pair of differential signals at connecting ports of the second signal transforming circuit.

20 Claims, 6 Drawing Sheets

(56) References Cited

OTHER PUBLICATIONS

Zhao, Y., et al.; "A 60GHz-band 20dBm Power Amplifier with 20% Peak PAE;" IEEE; 2011; pp. 1-4.

Chen, J., et al; "A Compact 1V 18.6dBm 60GHz Power Amplifier in 65nm CMOS;" IEEE International Solid-State Circuits Conference; Session 24; 2011; pp. 432-434.

Li, Y.A., et al.; "A Fully Integrated 77GHz FMCW Radar System in 65nm CMOS; IEEE International Solid-State Circuits Conference;" Session 11; 2010; pp. 216-218.

Law, C.Y., et al.; "A High-Gain 60GHz Power Amplifier with 20dBm Output Power in 90nm CMOS;" IEEE International Solid-State Circuits Conference; Session 23; 2010; pp. 426-428.

Zhao, Y., et al.; "Compact Transformer Power Combiners for Millimeter-wave Wireless Applications;" IEEE Radio Frequency Integrated Circuits Symposium; 2010; pp. 223-226.

Aoki, I., et al.; "Fully Integrated CMOS Power Amplifier Design Using the Distributed Active-Transformer Architecture;" IEEE Journal of Solid-State Circuits; vol. 37; No. 3; Mar. 2002; pp. 371-383.

Paul, C.R.; "Solutions of the Transmission-Line Equations for Three-Conductor Lines in Homogeneous Media;" IEEE Transactions on Electromagnetic Compatibility; vol. EMC-20; No. 1; Feb. 1978; pp. 216-222.

Wang, K.Y., et al.; "A 1V 19.3dBm 79GHz Power Amplifier in 65nm CMOS;" IEEE International Solid-State Circuits Conference; Session 15; pp. 260-262, 2012.

\* cited by examiner

SIGNAL PROCESSING APPARATUS

CROSS REFERENCE TO RELATED APPLICATIONS

This Application claims priority of U.S. Provisional Application No. 61/617,717, filed on Mar. 30, 2012, and the entirety of which is incorporated by reference herein.

BACKGROUND OF THE INVENTION

1. Field of the Invention

The present invention relates to circuitry, and in particular relates to a power combiner and a power distributor in a signal processing apparatus.

2. Description of the Related Art

Power amplifiers (PAs) are electronic devices that amplify power of RF signals by converting DC power into RF power in various RF transceiving devices and systems. Many amplifiers used in a transceiver system tend to occupy a large chip or board area, require high DC power, and need to dissipate heat generated during operation. When required power output level for the amplifier exceeds the capabilities of a signal power amplifier cell, multiple amplifier cells can be combined to produce the required output. Power combiners are closely related to wideband transformers in design and construction. A power distributor is a lower powered version of a power combiner and is used in reverse. The power distributor divides a source signal into multiple equal-amplitude driving signals to drive multiple PAs in the transceiving system or feed multiple phase shifters in a phased array system. Increased efficiency and linearity of the power combiners/distributors are demanded in wireless communications and other RF applications.

BRIEF SUMMARY OF THE INVENTION

A detailed description is given in the following embodiments with reference to the accompanying drawings.

An embodiment of a signal processing apparatus is described, comprising a first signal transforming circuit and a second signal transforming circuit. The first signal transforming circuit comprises four first coupled lines and two second coupled lines, wherein two ends of each first coupled line are configured to carry a first pair of differential signals respectively, each second coupled line is magnetically coupled to two of the first coupled lines in parallel and comprises two signal ports, to which the two ends of each of the magnetically-coupled first coupled lines are placed symmetrically for transferring a second pair of differential signals. The second signal transforming circuit is configured to convert between the second pairs of differential signals at the signal ports and a third pair of differential signals at connecting ports of the second signal transforming circuit.

Another embodiment of a signal processing apparatus is provided, comprising a first signal transforming circuit and a second signal transforming circuit. The first signal transforming circuit comprises four first coupled lines and two second coupled lines, wherein adjacent ends of two of the first coupled lines are configured to carry a first pair of differential signals respectively, each second coupled line is magnetically coupled to two of the first coupled lines in parallel and comprises two signal ports, to which the two ends of each of the magnetically-coupled first coupled lines are placed symmetrically, for transferring a second pair of differential signals. The second signal transforming circuit is configured to convert between the two second pairs of differential signals at the signal ports and a third pair of differential signals at connecting ports of the second signal transforming circuit.

Another embodiment of a signal processing apparatus is described, comprising a first signal transforming circuit and a second signal transforming circuit. The first signal transforming circuit comprises four of first coupled lines and two of second coupled lines magnetically coupled thereto in parallel, the four first coupled lines and the second coupled lines are arranged to simultaneously form four near-side excitation (NSE) units and four far-side excitation (FSE) units. Each of the NSE units comprises first and second near-side ports and a first feed port, a first transfer function of signals on the first near-side port and the first feed port and a second transfer function of signals on the second near-side port and the first feed port are substantially inverse. Each of the FSE units comprises first and second far-side ports and a second feed port, a third transfer function of signals on the first far-side port and the second feed port and a fourth transfer function of signals on the second far-side port and the feed port are different by a mismatched term, wherein the mismatched term is substantially zero when a first pair of differential signals are carried by the first and second far-side ports. The second signal transforming circuit is configured to convert between two of third pairs of differential signals on the feed ports and a fourth pair of differential signals at connecting ports of the second signal transforming circuit.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
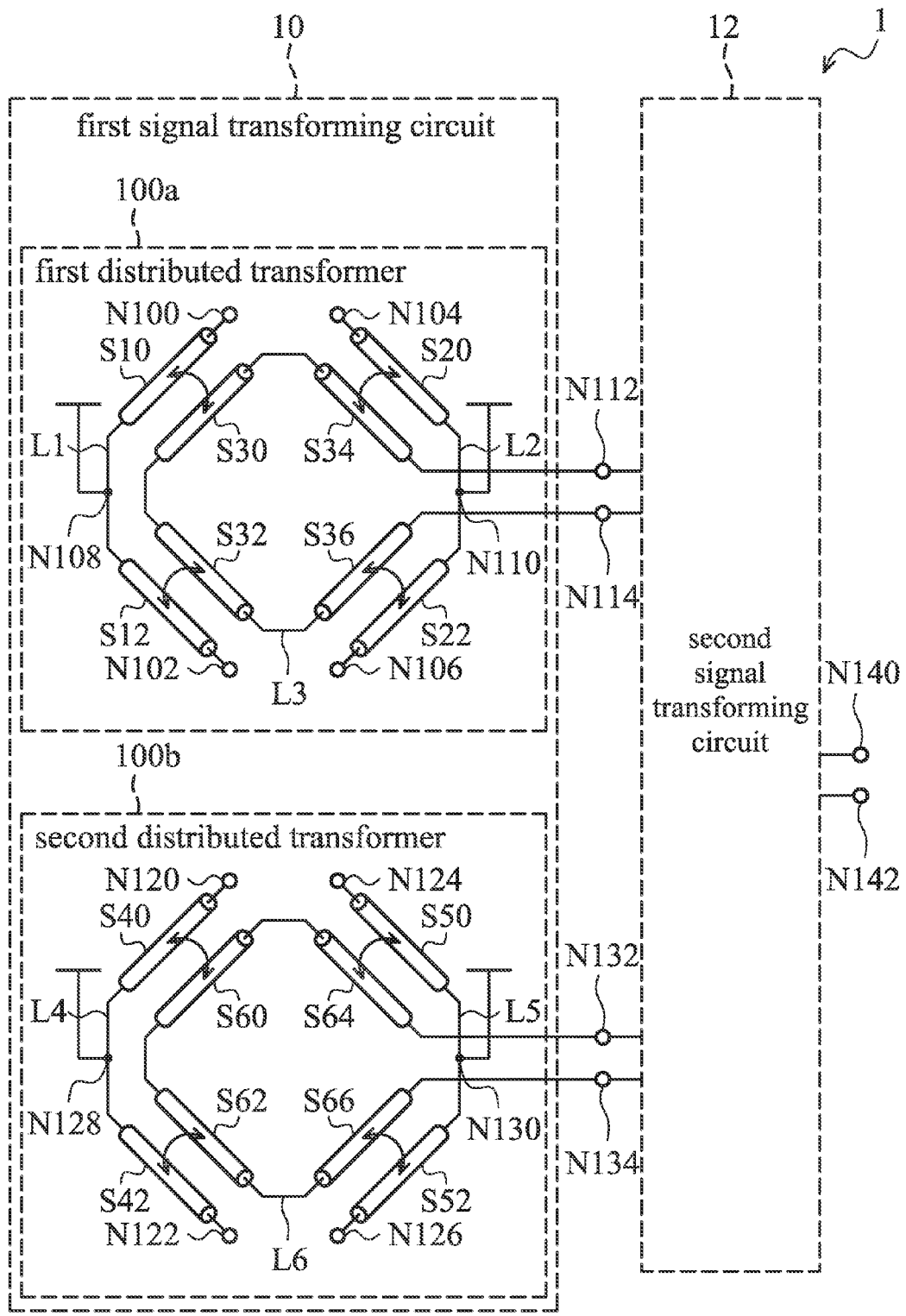
FIG. 1 is a circuit schematic of a signal processing apparatus 1 according to an embodiment of the invention.

FIG. 1 is a circuit schematic of a signal processing apparatus 1 according to an embodiment of the invention. The signal processing apparatus 1, comprising a first signal transforming circuit 10 and a second signal transforming circuit 12 coupled thereto, may be implemented in a transceiver in an integrated circuit for combining or distributing signals. The signal processing apparatus 1 is a reciprocal passive device which may serve as a power combiner or a power distributor, accepting input differential signals and delivering output differential signals at a wanted power level and impedance matching. When being used as a power combiner, input differential signals are fed into input ports N100, N102, N104, N106, N120, N122, N124, and N126 of the first signal transforming circuit 10 and an output differential signal is derived by a vector sum of the input differential signals at connecting ports N140 and N142 (e.g., the output ports of the power combiner) of the second signal transforming circuit 12. Conversely, when being used as a power distributor, input differential signals are applied to the connecting ports N140 and N142 (e.g., the input ports of the power distributor) of the second signal transforming circuit 12 and equal-magnitude and out-of-phase output differential signals are appeared at the output ports N100, N102, N104, N106, N120, N122, N124, and N126 of the first signal transforming circuit 10. The power combiner may be referred to as a signal combiner. The power distributor may be namely referred to as a power distributor, signal distributor, or a signal splitter. The input and output differential signals may be radio frequency (RF) signals and the signal processing apparatus 1 may be an RF circuitry.

The first signal transforming circuit 10 includes two fully-differential distributed transformers, namely, a first distributed transformer 100a and a second distributed transformer 100b. The first distributed transformer 100a contains two first coupled lines L1 and L2 and a second coupled line L3 coupled in parallel thereto. The input differential signals can be coupled magnetically and/or electrically between the first and second coupled lines. More specifically, the first coupled lines L1 and L2 are placed in a symmetrical manner to each other, each comprises two segments which, when acting as the power combiner can couple, both inductively and capacitively, input signals thereon to correspondingly parallel segments of the second coupled line L3. An AC ground may be placed at the middle ports (e.g., the center taps) N108 and N110 of the first coupled lines L1, L2 by tying to a DC feed, to a power supply or to a ground reference, or simply being left floating. Signal ports N112 and N114 of the second coupled line L3 can be placed near the AC ground port. The first distributed transformer 100a has four signal ports located at both ends of the first coupled lines L1 and L2, a pair of signal ports located at both ends of the second coupled line L3, and two decoupling capacitors (not shown) connected to the AC ground ports N108 and N110. In some embodiments, the first and second coupled lines may be implemented by transmission lines with a ground plane. In other embodiments, the first and second coupled lines may be implemented simply by circuit wiring with a conductor element placed nearby served as a ground reference.

When acting as the power combiner, the first coupled lines L1 and L2 can serve as primary circuits and the second coupled line L3 can serve as the secondary circuit of the distributed transformer. For examples, the segments S10, S12, S20, S22 can receive and couple the input differential signals to the segments S30, S32, S34, and S36 respectively, on which a vector sum of all coupled input signals is produced, rendering the output differential signals at ports N112 and N114. Each pair of coupled segments, such as the segments S10 and S30, the segments S20 and S34, have substantially the same length. The input differential signals may comprise a first signal and a second signal with the same amplitude and an out-of-phase phase relationship to each other. Specifically, the first signal is fed into the ports N100 and N106, and the second signal is fed into the ports N102 and N104. Because the input ports N100, N102, N104, and N106 in the primary circuit are placed at locations symmetrically to the output ports N112 and N114 in the secondary circuit, the input impedances looking into two ends of any first coupled line are substantially matched to each other, resulting in increased coupling effect between the primary and the secondary circuits and reduced mismatches of the transferred signals.

Conversely, when acting as the power distributor, the second coupled line L3 can serve as primary circuit and the first coupled lines L1 and L2 can serve as the secondary circuits of the distributed transformer 100a. Accordingly, ports N112 and N114 can each receive one of the input differential signals, which are subsequently coupled to the segments S10, S12, S20, S22 on the first coupled lines through the segments S30, S32, S34, and S36 on the second coupled line and split into output differential signals, rendering the output signals at ports N100 and N106 have substantially the same amplitude and phase relationship, the output signals at ports N102 and N104 have substantially the same amplitude and phase relationship, and the two sets of output signals show out-of-phase phase relationship. Since the power distributor has the same configuration as the power combiner, the discussion will mainly focus on the power combiners hereafter.

Since the number of input paths connected to one transformer-based combiner is limited to 4, the second distributed transformer combiner 100b is added for 8-path combining in order to achieve an increased output power. Similarly to the first distributed transformer 100a, the second distributed transformer 100b contains two first coupled lines L4 and L5 and a second coupled line L6 coupled in parallel thereto. The first coupled lines L4 and L5 are placed in a symmetrical manner to each other, each comprises two segments which couples input signals thereon to correspondingly parallel segments of the second coupled line L6. As the power combiner, the first signal fed onto the segments S40 and S52 and the second signal fed onto the segments S42 and S50 couples to correspondingly parallel segments S60, S66, S62, S64 respectively, rendering the output differential signals at ports N132 and N134, which are substantially the same as the output differential signal appearing at the ports N112 and N114. As the power distributor, the input differential signals input into the ports N132 and N134 are coupled to S40, S42, S50, S52 on the first coupled lines and split into two sets of output differential signals, resulting in the output signals at ports N120 and N126 and the output signals at ports N122 and N122 are out-of-phase to each other.

The second signal transforming circuit 12 accepts the output differential signals from the ports N112 and N114 and from the ports N132 and N134, and converts the two pairs into one pair of output differential signals for outputs at ports (e.g., the connecting ports) N140 and N142. In some implementations, the second signal transforming circuit 12 is implemented by another distributed transformer as the first or second distributed transformers, receiving the first pair of output differential signals from the ports N112 and N114 by two adjacent ends of the first coupled lines, and the second pair of output differential signals from the ports N132 and N134 by two other adjacent ends of the first coupled lines, thereby combining the two pairs of output differential signals into one resultant output differential signals. In other implementations, the second signal transforming circuit 12 is implemented by a transmission line combiner, detailed in FIG. 2 and FIG. 3, implemented by two pairs of differential transmission lines in parallel, combining the output signals at the ports N112 and N132 and the output signals at the ports N114 and 134 together to provide the output differential signals at the connecting ports N140 and N142. Each pair of differential transmission lines are placed closely in parallel, and transform the 100 ohms differential load to lower impedances at the connecting ports N140 and N142. The transmission line combiner can provide wide operating bandwidths. Typical structures for transmission-line combiner consist of parallel wires, coaxial cables, or bifilar twisted wire pairs. Although the occupied area for the transmission line combiner is more than that of the transformer combiner, a transmission-line combiner with well-defined ground plane has the advantage in confining the signal wave, leading to reduced signal loss in the output differential signal.

It would be appreciated by people with ordinary skills in the art that two or more second distributed transformers may be incorporated into the first signal transforming circuit 10 and two or more differential transmission lines may be incorporated into the second signal transforming circuit 12 based on the principle of the invention.

The signal processing apparatus 1 discloses a circuit arrangement for the power combiner and the power distributor with matched input impedances, operated by input differential signals, rendering a simpler signal control and reduced signal loss during signal combination or distribution.

Figure 2:
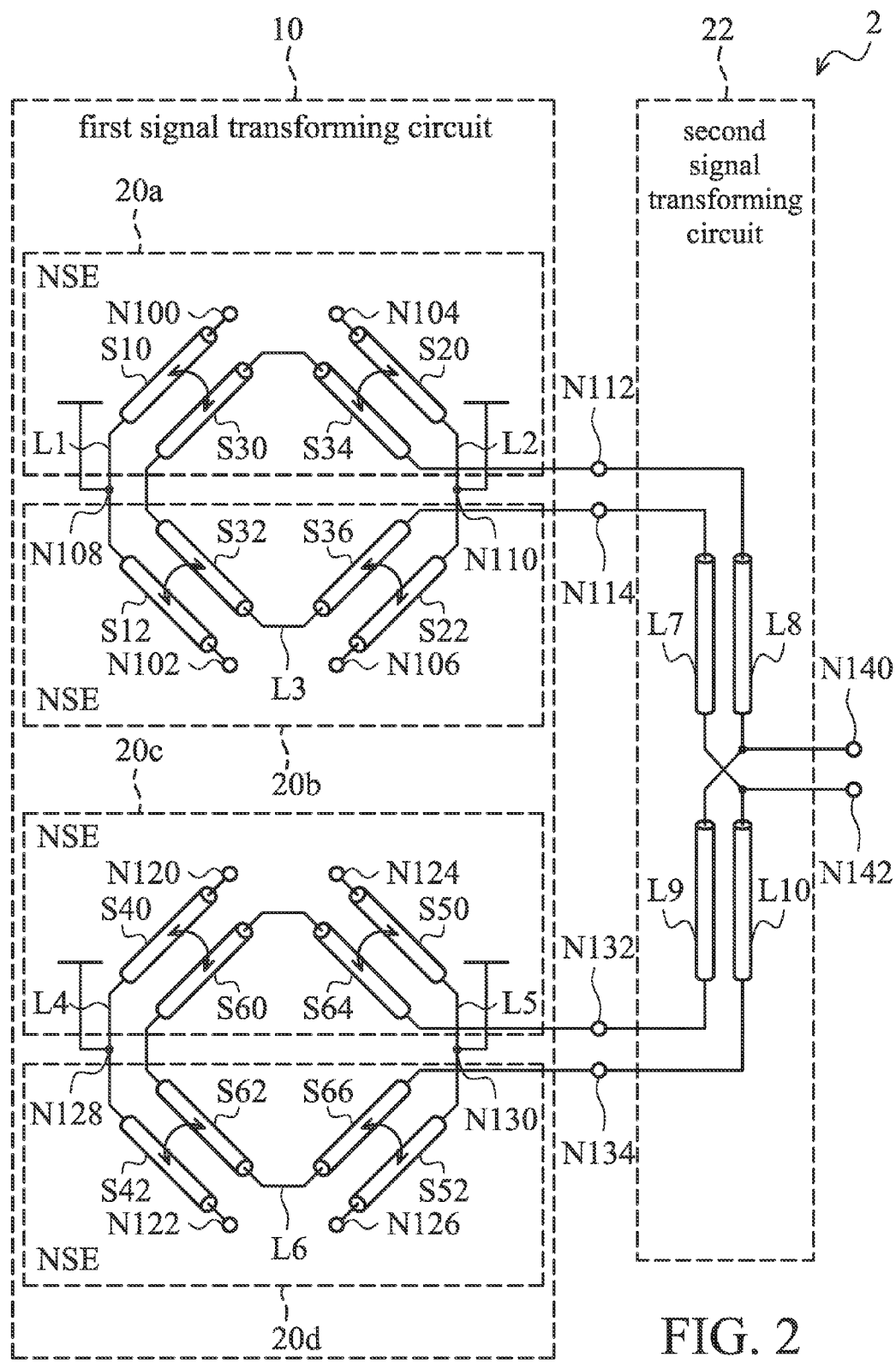
FIG. 2 is a circuit schematic of a signal processing apparatus 2 according to another embodiment of the invention, with Near Side Excitation (NSE) circuits being highlighted for explanation.

FIG. 2 is a circuit schematic of a signal processing apparatus 2 according to another embodiment of the invention, with Near Side Excitation (NSE) units being highlighted for explanation. The signal processing apparatus 2 employs the transmission line combiner as the second signal transforming circuit 12. The first signal transforming circuit 10 in FIG. 2, comprising two distributed transformers, can be represented by four NSE units 20a-d. Each NSE unit 20 contains two adjacent segments on the two first coupled lines and the corresponding coupled segments on the second coupled line. For example, the NSE unit 20a contains the two adjacent segments S10 and S20 on the first coupled lines L1 and L2 respectively, and the corresponding coupled segments S30 and S34 on the second coupled line L3. As a power combiner, when a pair of fully differential signals are fed into the two adjacent signal ports N100 and N104, a corresponding pair of outcome signals with a substantially an identical magnitude and in-phase relationship can be combined to render the output signals at the signal ports (e.g., the feed port of the NSE unit) N112 and N114. The input impedances looking into the adjacent signal ports N100 and N104 are substantially identical to each other, regardless of the unequal output loading at the ends of the coupled segments S30 and S34. Accordingly, the NSE units 20b-d receive the pair of fully differential signals to produce and combine the corresponding pair of the in-phase outcome signals, resulting in the output signals at the signal ports (e.g., the feed port of the NSE unit) N112 and N114, and N132 and 134 respectively.

The transmission line combiner in the second signal transforming circuit comprises two pairs of differential transmission lines, L7 and L8, and L9 and L10. Each pair of differential transmission lines are coupled to the differential output ports of a distributed transformer. For example, the transmission line pair L8 and L7 can receive the output differential signals from the signal ports N112 and N114, the transmission line pair L9 and L10 can receive the output differential signals from the signal ports N132 and N134. The transmission lines L8 and L9 are connected together to combine the output signals with the positive polarity together, producing the one signal of the output differential signals at the connecting port N140. Similarly, the transmission lines L7 and L10 are connected together to combine the output signals with the negative polarity together, yielding the other complementary signal of the output differential signals at the connecting port N142.

Figure 4:
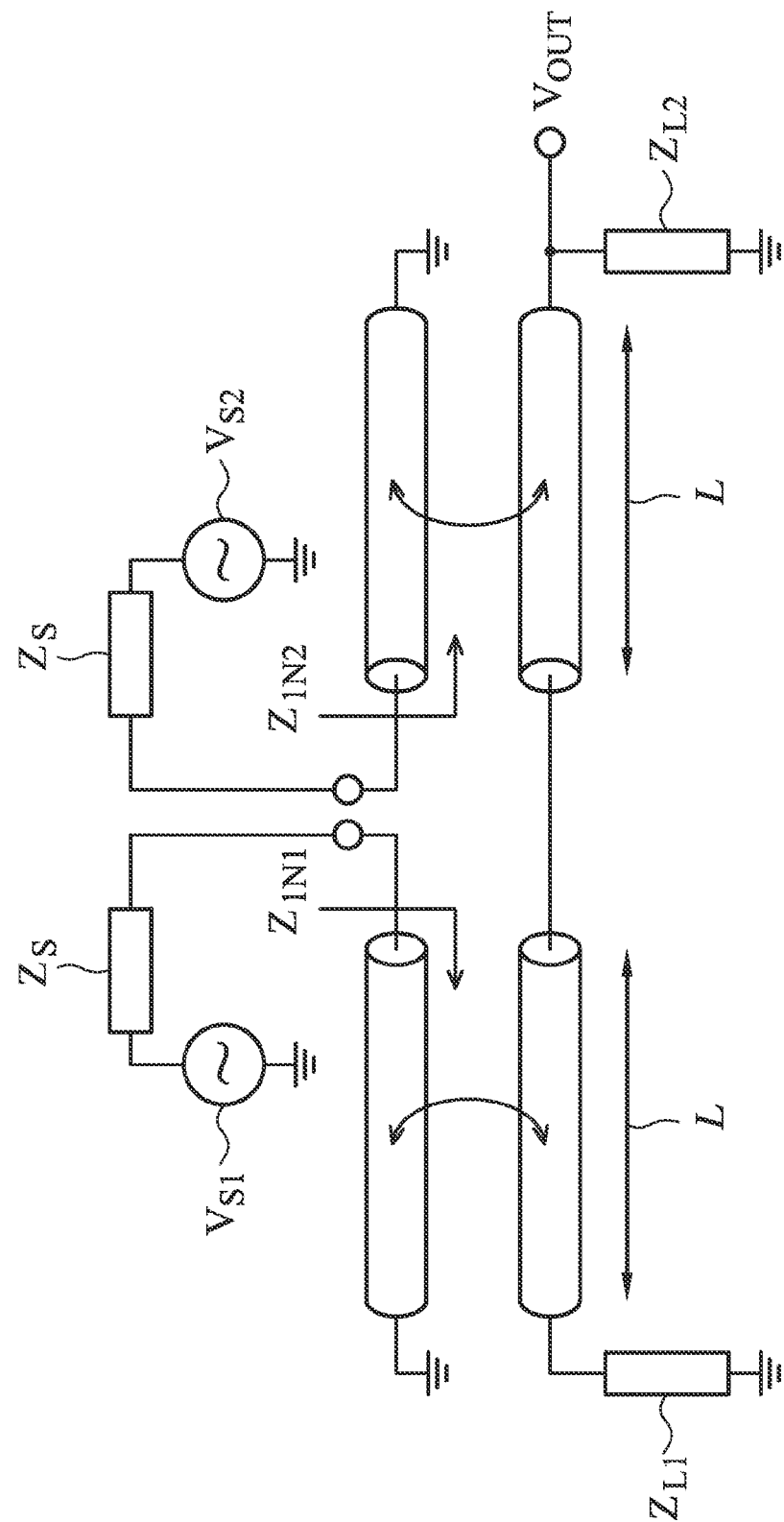
FIG. 4 illustrates a near-side excitation circuit 4 incorporated in the signal processing apparatus 2.

Referring now to FIG. 4, which illustrates a near-side excitation (NSE) circuit 4 incorporated as the NSE unit of the signal processing apparatus 2. For a pair of coupled lines, including a primary coupled line and a secondary coupled line with length L, the voltage signals on the primary and secondary coupled lines can be expressed by Eq. [1] and Eq. [2]:

$$\begin{bmatrix} V_P(0) \\ V_S(0) \end{bmatrix} = \begin{bmatrix} V_e - Z_{P0}i_P(0) \\ -Z_{S0}i_S(0) \end{bmatrix} \quad \text{Eq. [1]}$$

$$\begin{bmatrix} V_P(L) \\ V_S(L) \end{bmatrix} = \begin{bmatrix} Z_{PL}i_P(L) \\ Z_{SL}i_S(L) \end{bmatrix} \quad \text{Eq. [2]}$$

Where $V_P(0)$ and $V_S(0)$ are the voltage signals at length 0 on the primary and secondary coupled line respectively;

$V_P(L)$ and $V_P(L)$ are the voltage signals at length L on the primary and secondary coupled line respectively;

$i_P(0)$ and $i_S(0)$ are the current signals at length 0 on the primary and secondary coupled line respectively;

$i_P(L)$ and $i_S(L)$ are the current signals at length L on the primary and secondary coupled line respectively;

$Z_{P0}$, $Z_{S0}$ are input loadings connected to the ends at length 0 on the primary and secondary lines respectively;

$Z_{PL}$, $Z_{SL}$ are output loadings connected to the ends at length L on the primary and secondary lines respectively; and $V_e$ is the input signal;

The set of coupled lines, comprising two primary coupled lines and a secondary coupled line, receives input signals $V_{S1}$ and $V_{S2}$ from near ends of the two primary coupled lines, and an output signal $V_{OUT}$ is being detected at one end (e.g., the first feed port) of the secondary coupled line. The transfer functions $T_{1,NSE}$ and $T_{2,NSE}$ for the output signal $V_{OUT}$ verses the input $V_{S1}$ and $V_{S2}$ can be expressed by Eq. [3] and Eq. [4].

$$T_{1,NSE} = \frac{V_{OUT}}{V_{S1}}(V_{S2} = 0) \quad \text{Eq. [3]}$$

$$T_{2,NSE} = \frac{V_{OUT}}{V_{S2}}(V_{S1} = 0) \quad \text{Eq. [4]}$$

Based on the Eq. [5] in approximation of homogeneous surroundings and reference incorporated in Clayton R. Paul, Trans. EMC, February, 1978, the two transfer functions $T_{1,NSE}$ and $T_{2,NSE}$ exhibit an out-of-phase relationship, as expressed in Eq. [6]. Therefore, when input signals $V_{S1}$ and $V_{S2}$ are a pair of differential signals applied to the near ends of the two primary coupled lines, the corresponding output signals can be added constructively, producing an increased or maximal power in the output signal $V_{OUT}$. Further, the input impedances $Z_{IN1}$ and $Z_{IN2}$ looking into the two primary coupled lines are substantially equal to each other, shown by Eq. [7].

$$\begin{pmatrix} V_P(L) \\ V_S(L) \\ i_P(L) \\ i_S(L) \end{pmatrix} = \quad \text{Eq. [5]}$$

$$\begin{bmatrix} \begin{bmatrix} C & 0 \\ 0 & C \end{bmatrix} & -j\omega LS \begin{bmatrix} L_P & L_M \\ L_M & L_S \end{bmatrix} \\ -j\omega LS \begin{bmatrix} C_P + C_M & -C_M \\ -C_M & C_S + C_M \end{bmatrix} & \begin{bmatrix} C & 0 \\ 0 & C \end{bmatrix} \end{bmatrix} \begin{pmatrix} V_P(0) \\ V_S(0) \\ i_P(0) \\ i_S(0) \end{pmatrix}$$

where $C = \cos(\beta L)$; and $$S = \frac{\sin(\beta L)}{\beta L}.$$

$$T_{1,NSE} = -T_{2,NSE} \quad \text{Eq. [6]}$$

$$Z_{IN1} = Z_{IN2} \quad \text{Eq. [7]}$$

Figure 6:
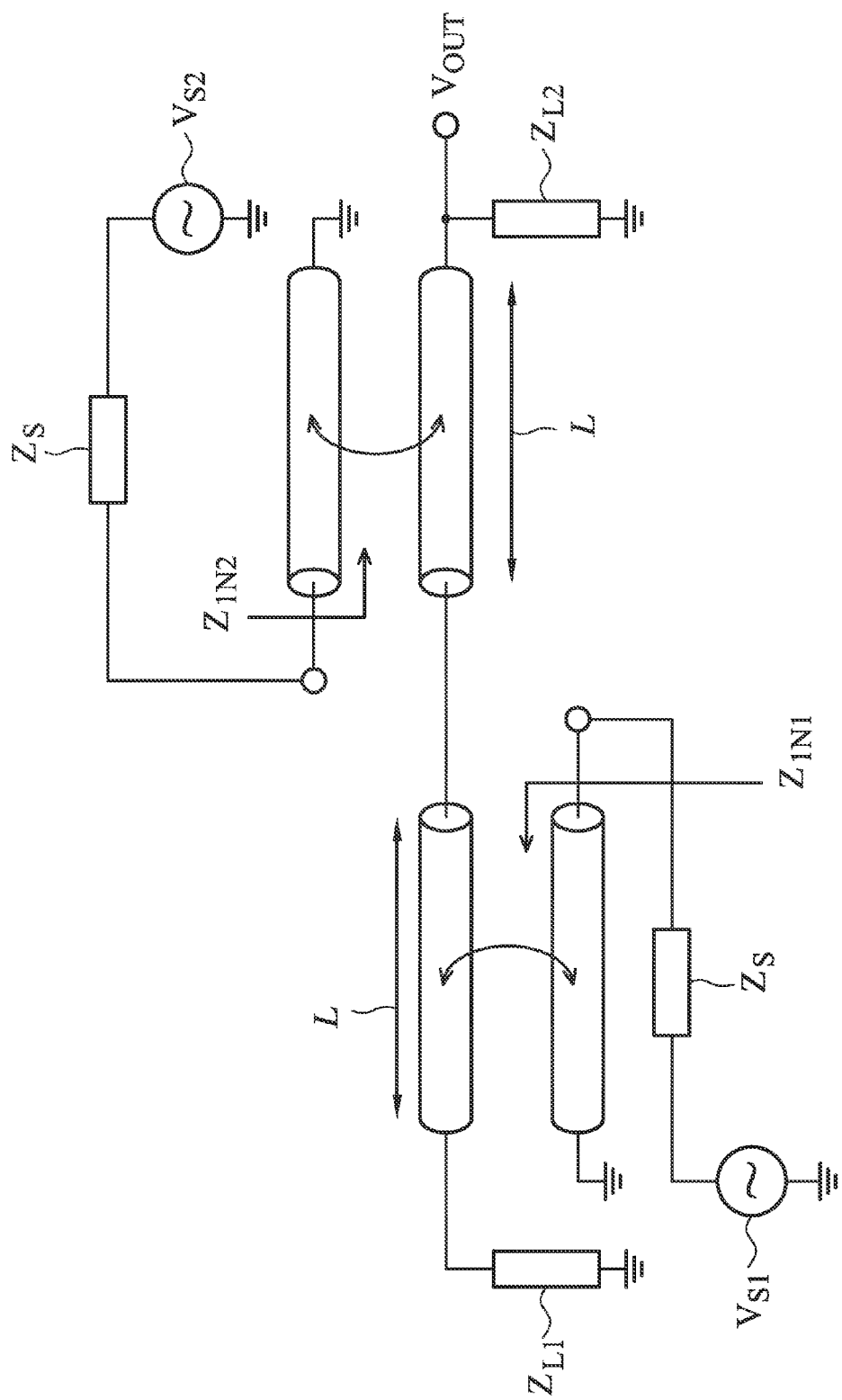
FIG. 6 illustrates a near-side excitation circuit 6 incorporated in the signal processing apparatus 2.

Referring to FIG. 6, illustrating another near-side excitation (NSE) circuit 6 incorporated as the NSE unit of the signal processing apparatus 2. The NSE circuit 6 is similar to the NSE circuit 4, except that the 2 primary coupled lines may lie on the opposite sides of the secondary coupled line, with each primary coupled line coupled to a different segment of the secondary coupled line and each primary coupled line being symmetrical to the other about the secondary coupled line. For the NSE circuit 6, the equations Eq. [6] and Eq. [7] are also valid. The input impedances $Z_{IN1}$ and $Z_{IN2}$ looking into the two primary coupled lines are substantially matched regardless of the impedances of the output loadings $Z_{L1}$ and $Z_{L2}$. In addition, the transfer functions $T_{1,NSE}$ and $T_{2,NSE}$ display an out-of-phase relationship. Therefore, when the pair of differential signals $V_{S1}$ and $V_{S2}$ is input to the near ends of the two primary coupled lines, the output signals $V_{OUT}$ can be added positively, producing an increased or maximal power in the output signal $V_{OUT}$.

The NSE circuits 4 and 6 require merely a pair of differential signals $V_{S1}$ and $V_{S2}$ for producing the maximal power for the output signal $V_{OUT}$, reducing input signal control complexity and increasing circuit efficiency.

Figure 3:
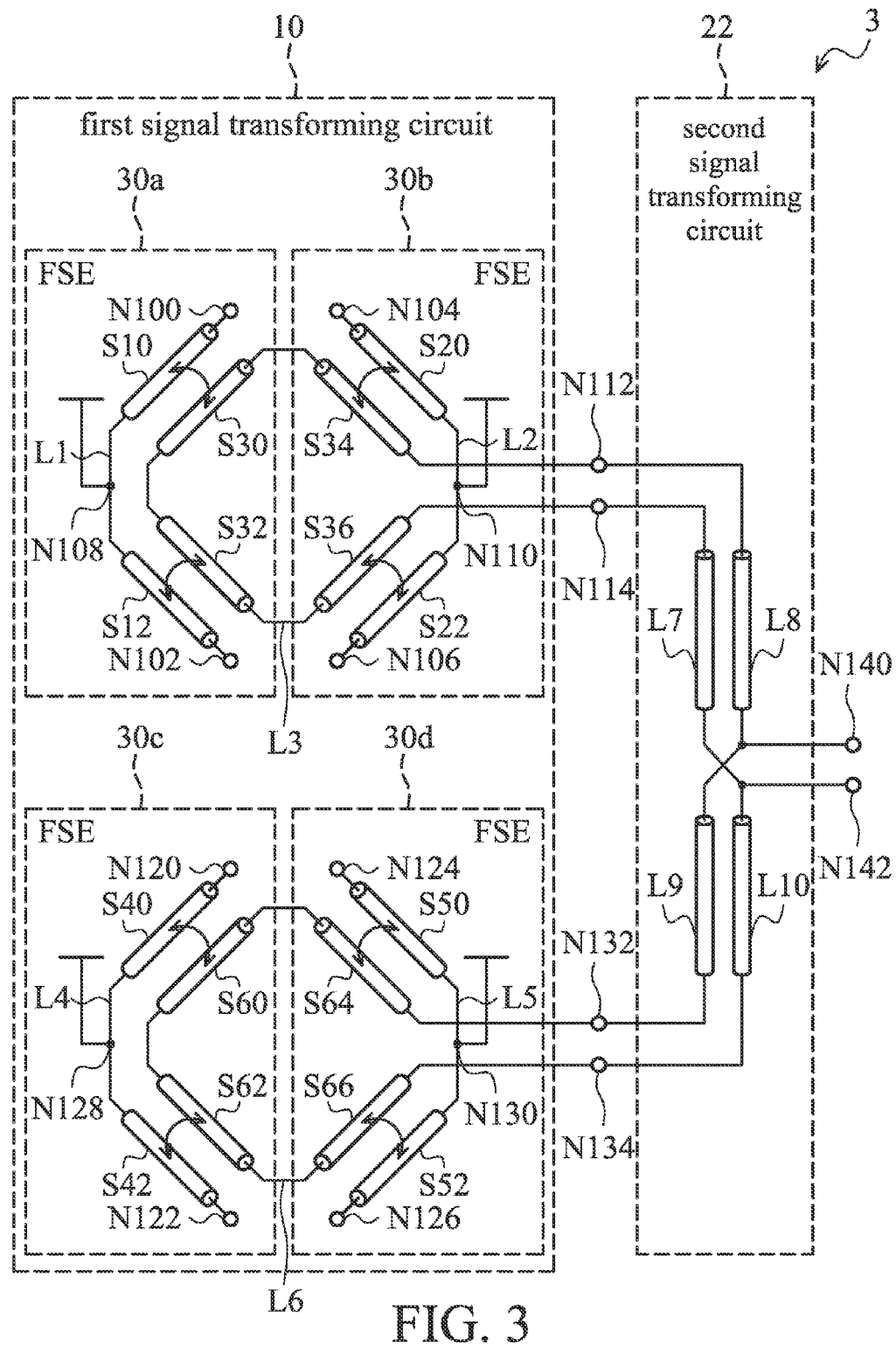
FIG. 3 is a circuit schematic of a signal processing apparatus 3 according to another embodiment of the invention, with Far Side Excitation (FSE) circuits being highlighted for explanation.

FIG. 3 is a circuit schematic of a signal processing apparatus 3 according to another embodiment of the invention, with Far Side Excitation (FSE) units being highlighted for explanation. The signal processing apparatus 3 employs the transmission line combiner as the second signal transforming circuit 12. The first signal transforming circuit 10 in FIG. 3 can be represented by four FSE units 30a-d. Each FSE unit 30 contains two segments constituting the first coupled lines and the corresponding coupled segments on the second coupled line. For example, the FSE unit 30a contains the two segments S10 and S12 on the first coupled line L1, and the corresponding coupled segments S30 and S32 on the second coupled line L3. As a power combiner, when a pair of fully differential signals are fed into the two signal ports N100 and N102, a corresponding pair of outcome signals with a substantially an identical magnitude and in-phase relationship can be combined to render the output signals at the signal ports (e.g., the feed port of the FSE unit) N112 and N114. Due to the circuit symmetry of the FSE unit 30a, the input impedances looking into the adjacent signal ports N100 and N102 are substantially identical to each other. Accordingly, the FSE units 30b-d receive the pair of fully differential signals to produce and combine the corresponding pair of the in-phase outcome signals, resulting in the output signals at the signal ports N112 and N114, and N132 and 134 respectively. In some embodiments, two NSE units are placed vertically along each other, resulting in a fully-differentially connected circuit as the FSE units. The transmission line combiner in FIG. 3 is identical to that in FIG. 2, references therefor can be find in the preceding description and will not be repeated here.

Figure 5:
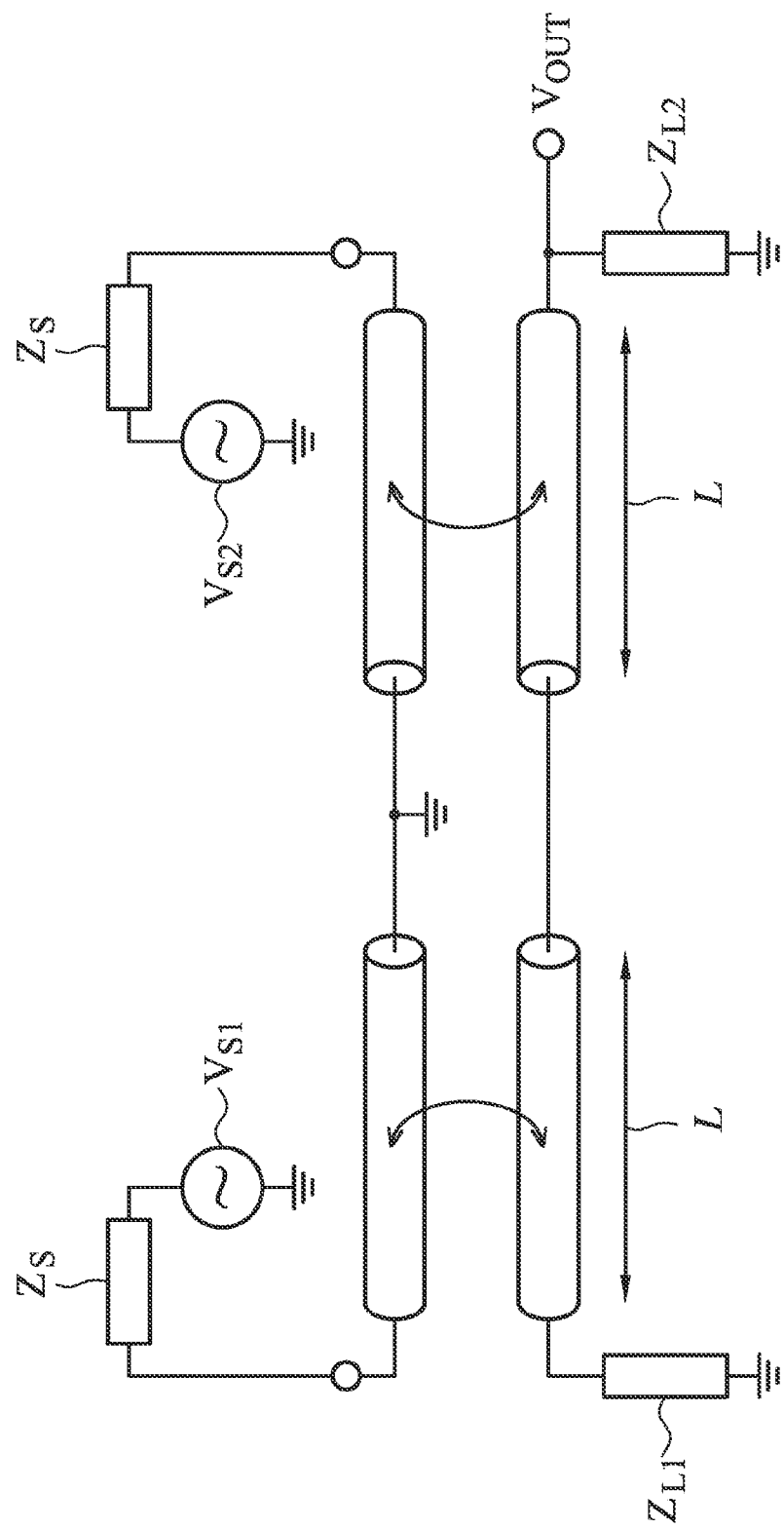
FIG. 5 illustrates a far-side excitation circuit 5 incorporated in the signal processing apparatus 3.

Referring to FIG. 5, illustrating a far-side excitation circuit 5 incorporated in the signal processing apparatus 3. The set of coupled lines in the FSE unit 5, comprising a primary coupled lines and a secondary coupled line, receives input signals $V_{S1}$ and $V_{S2}$ from two ends of the primary coupled lines, and an output signal $V_{OUT}$ is being detected at one end (e.g., the feed port of the FSE unit) of the secondary coupled line. The FSE unit 5 is fully differentially connected with matched input loading $Z_S$ and matched output loading $Z_{L2}$. Based on the Eq. [5] in approximation of homogeneous surroundings and reference incorporated in Clayton R. Paul, Trans. EMC, February, 1978, two transfer functions $T_{1,NSE}$ and $T_{2,NSE}$ for the output signal $V_{OUT}$ verses the input $V_{S1}$ and $V_{S2}$ do not show a well-matched relationship, as expressed in Eq. [8] and Eq. [9]. A mismatch term $\Delta T$ is present in Eq. [8] on the top of the wanted differential relationship for the transfer functions $T_{1,NSE}$ and $T_{2,NSE}$. In particularly, the mismatch term $\Delta T$ would be reduced to 0 and the transfer functions $T_{1,FSE}$ and $T_{2,FSE}$ would be equivalent when the far-side excitation circuit 5 is connected in a fully differential configuration and the differential signals pair $V_{S1}$ and $V_{S2}$ is fed onto the primary coupled line. The fully differential connected far-side excitation circuit 5 includes 2 sets of identical primary coupled lines connected together at a point of symmetry so that the input/output signals are no longer referenced to a ground, but rather swings relative to each other, and 1 set of secondary coupled line attached to the loadings $Z_{L1}$ and $Z_{L2}$ at the two ends, with $Z_{L1}=Z_{L2}$. When the differential signals pair $V_{S1}$ and $V_{S2}$ is applied to the far ends of the primary coupled line, the corresponding output signals can be added constructively, producing an increased or maximal power boost in the output signal $V_{OUT}$. Thus again when input signals $V_{S1}$ and $V_{S2}$ are a pair of differential signals applied to the far ends of the primary coupled line, the corresponding output signals can be added constructively, producing an increased or maximal power boost in the output signal $V_{OUT}$.

$$T_{1,NSE} = -T_{2,NSE} + \Delta T \quad \text{Eq. [8]}$$

$$\Delta T = \frac{-Z_{L2}}{D}[(-j\omega LSCL_M Z_S)(C^2 - 1) + \quad \text{Eq. [9]}$$
$$(\omega LS)^2(\ \ldots\ ) + jC(\omega LS)^3(\ \ldots\ ) + (\omega LS)^4(\ \ldots\ )]$$

where $C = \cos(\beta L)$;

$$\beta = \frac{2\pi}{\lambda};$$

$$S = \frac{\sin(\beta L)}{\beta L};$$

and

D is a non-zero denominator term.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A signal processing apparatus, comprising:
a first signal transforming circuit, comprising:
four first coupled lines, wherein two ends of each first coupled line are configured to carry a first pair of differential signals respectively; and
two second coupled lines, wherein each second coupled line is magnetically coupled to two of the first coupled lines in parallel and comprises two signal ports, to which the two ends of each of the magnetically-coupled first coupled lines are placed symmetrically for transferring a second pair of differential signals; and
a second signal transforming circuit, configured to convert between the second pairs of differential signals at the signal ports and a third pair of differential signals at connecting ports of the second signal transforming circuit.

2. The signal processing apparatus of claim 1, wherein adjacent ends of the two of the first coupled lines, which are magnetically coupled to the same second coupled line, are configured to respectively carry the first pair of differential signals.

3. The signal processing apparatus of claim 1, wherein the four ends of the two of the first coupled lines, which are magnetically coupled to the same second coupled line, have substantially matched input impedances.

4. The signal processing apparatus of claim 1, wherein a center tap of each first coupled line is coupled to an AC ground.

5. The signal processing apparatus of claim 1, being a power combiner, the four first coupled lines and the two second coupled lines constitute primary circuits and secondary circuits of a distributed transformer respectively, the first pair of differential signals are fed into the four first coupled lines and combined into the two second pairs of differential signals by the two second coupled lines, and the two second pairs of differential signals are converted into the third pair of differential signals by the second signal transforming circuit.

6. The signal processing apparatus of claim 1, being a power distributor, the two second coupled lines and the four first coupled lines constitute primary circuits and secondary circuits of a distributed transformer respectively, the third pair of differential signals is fed into the second signal transforming circuit and converted into the second pairs of differential signals, which are then distributed into the first pair of differential signals by the first signal transforming circuit.

7. The signal processing apparatus of claim 1, wherein the second signal transforming circuit is implemented by two groups of transmission lines electrically connected in parallel.

8. The signal processing apparatus of claim 1, wherein the second signal transforming circuit is implemented by a distributed transformer.

9. A signal processing apparatus, comprising:
a first signal transforming circuit, comprising:
four first coupled lines, wherein adjacent ends of two of the first coupled lines are configured to carry a first pair of differential signals respectively; and
two second coupled lines, wherein each second coupled line is magnetically coupled to two of the first coupled lines in parallel and comprises two signal ports, to which the two ends of each of the magnetically-coupled first coupled lines are placed symmetrically, for transferring a second pair of differential signals; and
a second signal transforming circuit, configured to convert between the two second pairs of differential signals at the signal ports and a third pair of differential signals at connecting ports of the second signal transforming circuit.

10. The signal processing apparatus of claim 9, wherein two ends of each first coupled line are configured to carry the first pair of differential signals respectively.

11. The signal processing apparatus of claim 9, wherein the four ends of the two of the first coupled lines, which are magnetically coupled to the same second coupled line, have substantially matched input impedances.

12. The signal processing apparatus of claim 9, wherein a center tap of each first coupled line is coupled to an AC ground.

13. The signal processing apparatus of claim 9, being a power combiner, the four first coupled lines and the two second coupled lines constitute primary circuits and secondary circuits of a distributed transformer respectively, the first pair of differential signals are fed into the four first coupled lines and combined into the two second pairs of differential signals by the two second coupled lines, and the two second pairs of differential signals are converted into the third pair of differential signals by the second signal transforming circuit.

14. The signal processing apparatus of claim 9, being a power distributor, the two second coupled lines and the four first coupled lines constitute primary circuits and secondary circuits of a distributed transformer respectively, the third pair of differential signals is fed into the second signal transforming circuit and converted into the second pairs of differential signals, which are then distributed into the first pair of differential signals by the first signal transforming circuit.

15. The signal processing apparatus of claim 9, wherein the second signal transforming circuit is implemented by two groups of transmission lines electrically connected in parallel.

16. The signal processing apparatus of claim 9, wherein the second signal transforming circuit is implemented by a distributed transformer.

17. A signal processing apparatus, comprising:
a first signal transforming circuit comprising four of first coupled lines and two of second coupled lines magnetically coupled thereto;
wherein the four first coupled lines and the second coupled lines are arranged to simultaneously form four near-side excitation (NSE) units and four far-side excitation (FSE) units, each of the NSE units comprises first and second near-side ports and a first feed port, a first transfer function of signals on the first near-side port and the first feed port and a second transfer function of signals on the second near-side port and the first feed port are substantially inverse; and each of the FSE units comprises first and second far-side ports and a second feed port, a third transfer function of signals on the first far-side port and the second feed port and a fourth transfer function of signals on the second far-side port and the feed port are different by a mismatched term, wherein the mismatched term is substantially zero when a first pair of differential signals are carried by the first and second far-side ports; and
a second signal transforming circuit, configured to convert between two second pairs of differential signals at two ends of the second coupled lines and a third pair of differential signals at connecting ports of the second signal transforming circuit.

18. The signal processing apparatus of claim 17, wherein adjacent ends of the two of the first coupled lines which are magnetically coupled to the same second coupled line are configured to respectively carry the first pair of differential signals.

19. The signal processing apparatus of claim 17, wherein the four ends of the two of the first coupled lines which are magnetically coupled to the same second coupled line have substantially matched input impedances.

20. The signal processing apparatus of claim 17, wherein two of the NSE units, which use the same second coupled line, are arranged to be fully-differential to make the mismatched term substantially zero.

* * * * *